United States Patent
Koevoets et al.

(10) Patent No.: US 9,684,249 B2
(45) Date of Patent: Jun. 20, 2017

(54) LITHOGRAPHIC APPARATUS WITH A METROLOGY SYSTEM FOR MEASURING A POSITION OF A SUBSTRATE TABLE

(71) Applicant: ASML Netherlands B.V., Veldhoven (NL)

(72) Inventors: Adrianus Hendrik Koevoets, Mierlo (NL); Sjoerd Nicolaas Lambertus Donders, Vught (NL); Theodorus Petrus Maria Cadee, Asten (NL)

(73) Assignee: ASML Netherlands B.V., Veldhoven (NL)

( * ) Notice: Subject to any disclaimer, the term of this patent is extended or adjusted under 35 U.S.C. 154(b) by 189 days.

(21) Appl. No.: 14/375,264

(22) PCT Filed: Jan. 25, 2013

(86) PCT No.: PCT/EP2013/051479
§ 371 (c)(1),
(2) Date: Jul. 29, 2014

(87) PCT Pub. No.: WO2013/113633
PCT Pub. Date: Aug. 8, 2013

(65) Prior Publication Data
US 2014/0368800 A1 Dec. 18, 2014

Related U.S. Application Data

(60) Provisional application No. 61/592,243, filed on Jan. 30, 2012.

(51) Int. Cl.
*G03B 27/42* (2006.01)
*G03F 7/20* (2006.01)

(52) U.S. Cl.
CPC ...... *G03F 7/70775* (2013.01); *G03F 7/70833* (2013.01); *G03F 7/70858* (2013.01)

(58) Field of Classification Search
CPC ............ G03F 7/70775; G03F 7/70833; G03F 7/70858
(Continued)

(56) References Cited

U.S. PATENT DOCUMENTS 5,610,715 A 3/1997 Yoshii et al.
6,359,678 B1 3/2002 Ota
(Continued)

FOREIGN PATENT DOCUMENTS

EP 2 515 170 A2 10/2012
JP 05-062871 A 3/1993
(Continued)

OTHER PUBLICATIONS

International Search Report directed to related International Patent Application No. PCT/EP2013/051479, mailed Jul. 8, 2013; 3 pages.
(Continued)

*Primary Examiner* — Peter B Kim
(74) *Attorney, Agent, or Firm* — Sterne, Kessler, Goldstein & Fox P.L.L.C.

(57) ABSTRACT

A lithographic apparatus comprises a substrate table for accommodating a substrate; a projection system for imaging a pattern onto the substrate, and a metrology system for measuring a position of the substrate table with respect to the projection system. The metrology system comprises a metrology frame connected to the projection system, a grid positioned stationary with respect to the metrology frame, and an encoder connected to the substrate table and facing the grid for measuring the position of the substrate table relative to the grid. The metrology frame has a surface oriented towards the substrate table, and the surface has been configured, e.g., by writing or etching, so as to form the grid.

17 Claims, 3 Drawing Sheets

(58) Field of Classification Search
USPC .................................................. 355/53, 72
See application file for complete search history.

(56) References Cited

U.S. PATENT DOCUMENTS

| | | | |
|---|---|---|---|
| 7,740,362 | B1 | 6/2010 | Neil et al. |
| 8,610,089 | B2 | 12/2013 | Donders et al. |
| 2002/0048096 | A1 | 4/2002 | Melzer et al. |
| 2004/0244963 | A1 | 12/2004 | Hazelton |
| 2005/0057102 | A1 | 3/2005 | Totsu et al. |
| 2005/0168714 | A1 | 8/2005 | Renkens et al. |
| 2008/0073563 | A1* | 3/2008 | Novak ............... G03F 7/70758 250/441.11 |
| 2008/0291413 | A1 | 11/2008 | Steijaert et al. |
| 2010/0163221 | A1 | 7/2010 | Ruijl et al. |
| 2011/0051267 | A1 | 3/2011 | Kierey et al. |
| 2011/0170078 | A1 | 7/2011 | Loopstra et al. |
| 2011/0211178 | A1 | 9/2011 | Sogard et al. |
| 2011/0317137 | A1 | 12/2011 | Donders et al. |
| 2012/0050709 | A1* | 3/2012 | Van Der Pasch ..... G03F 7/7085 355/67 |
| 2012/0267550 | A1 | 10/2012 | Donders et al. |
| 2014/0340659 | A1 | 11/2014 | Van Schoot et al. |

FOREIGN PATENT DOCUMENTS

| | | |
|---|---|---|
| JP | H11-243052 A | 9/1999 |
| JP | 2002-189193 A | 7/2002 |
| JP | 2006-526757 A | 11/2006 |

OTHER PUBLICATIONS

International Preliminary Report on Patentability and Written Opinion of the International Search Authority directed to related International Patent Application No. PCT/EP2013/051479, issued Aug. 5, 2014; 6 pages.

International Search Report directed to related International Patent Application No. PCT/EP2013/051480, mailed Oct. 18, 2013; 6 pages.

International Preliminary Report on Patentability and Written Opinion of the International Search Authority directed to related International Patent Application No. PCT/EP2013/051480, issued Aug. 5, 2014; 8 pages.

"Phase-change cooling," Wikipedia.org, accessed at http://en.wikipedia.org/wiki/Computer_cooling#Phase-change_cooling on Oct. 24, 2014; 1 page.

U.S. Appl. No. 14/375,457, Van Schoot et al., "Lithographic Apparatus and Device Manufacturing Method," filed Jul. 30, 2014.

English-Language Abstract for Japanese Patent Publication No. H11-243052 A, published Sep. 7, 1999; 2 pages.

* cited by examiner

LITHOGRAPHIC APPARATUS WITH A METROLOGY SYSTEM FOR MEASURING A POSITION OF A SUBSTRATE TABLE

CROSS-REFERENCE TO RELATED APPLICATIONS

This application claims the benefit of U.S. provisional application 61/592,243 which was filed on Jan. 30, 2012, and which is incorporated herein in its entirety by reference.

BACKGROUND

Field of the Present Invention

The present invention relates to a lithographic apparatus with a metrology system for measuring a position of a substrate table.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Within the lithographic apparatus it may be important that the position of a moveable item, e.g., the substrate table may be measured with a high precision by a metrology system with respect to a reference position, e.g., the projection system. For this purpose a metrology frame may be connected to at least a portion of the projection system to provide a reference. A reference grid plate may be mounted to the metrology frame and the grid plate may be used by an encoder mounted to the substrate table to measure the position of the substrate table. The grid plate may be sensitive for vibrations caused by turbulence caused by the moving substrate table.

SUMMARY

It is desirable to provide an improved metrology system.

An embodiment of the invention relates to a lithographic apparatus, comprising substrate table for accommodating a substrate, a projection system for imaging a pattern onto the substrate, and a metrology system for measuring a position to of the substrate table with respect to the projection system. The metrology system comprises a metrology frame connected to the projection system, a grid positioned stationary with respect to the metrology frame, and an encoder connected to the substrate table and facing the grid for measuring the position of the substrate table relative to the grid. The metrology frame has a surface oriented towards the substrate table, and the surface has been configured so as to form the grid.

The grid is formed by means of, e.g., writing or etching. It is known in the art to form a grid or a grating on a surface of a base material by means of, for example, photolithographic techniques involving chemical etching, physical etching with an ion-beam, writing (i.e., inscribing) with a laser beam, etc.

An embodiment of the lithographic apparatus of the invention further comprises: a deformation measurement system for measuring a thermally induced deformation of the metrology frame, and an adjustment system for adjusting the metrology system so as to compensate for the thermally induced deformation of the metrology frame.

As the grid is functionally and physically integrated with the metrology frame, a thermally induced deformation of the metrology frame causes, in general, a corresponding deformation of the grid, thus affecting the position, as measured, of the substrate table relative to the projection system. Accordingly, attention is given to reducing the influence of thermal effects on the position as measured.

In an embodiment of the lithographic apparatus, the adjustment system comprises a temperature control system for controlling a temperature of the metrology frame in dependence on the thermally induced deformation measured by the deformation measurement system. For example, the metrology frame is provided with a channel in an interior of the metrology frame for channeling a two-phase fluid, e.g., carbon dioxide. The temperature control system is operative to control a pressure of the two-phase fluid for controlling a heat transfer between the metrology frame and the two-phase fluid in the channel.

By providing the reference grid directly on the surface of the metrology frame the reference grid may be less sensitive to turbulence caused by, for example the moving substrate table because the metrology frame may be more stiff and heavier than the grid plate and therefore less sensitive for disturbance forces.

Further features and advantages of the present invention, as well as the structure and operation of various embodiments of the present invention, are to described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

Figure 1:
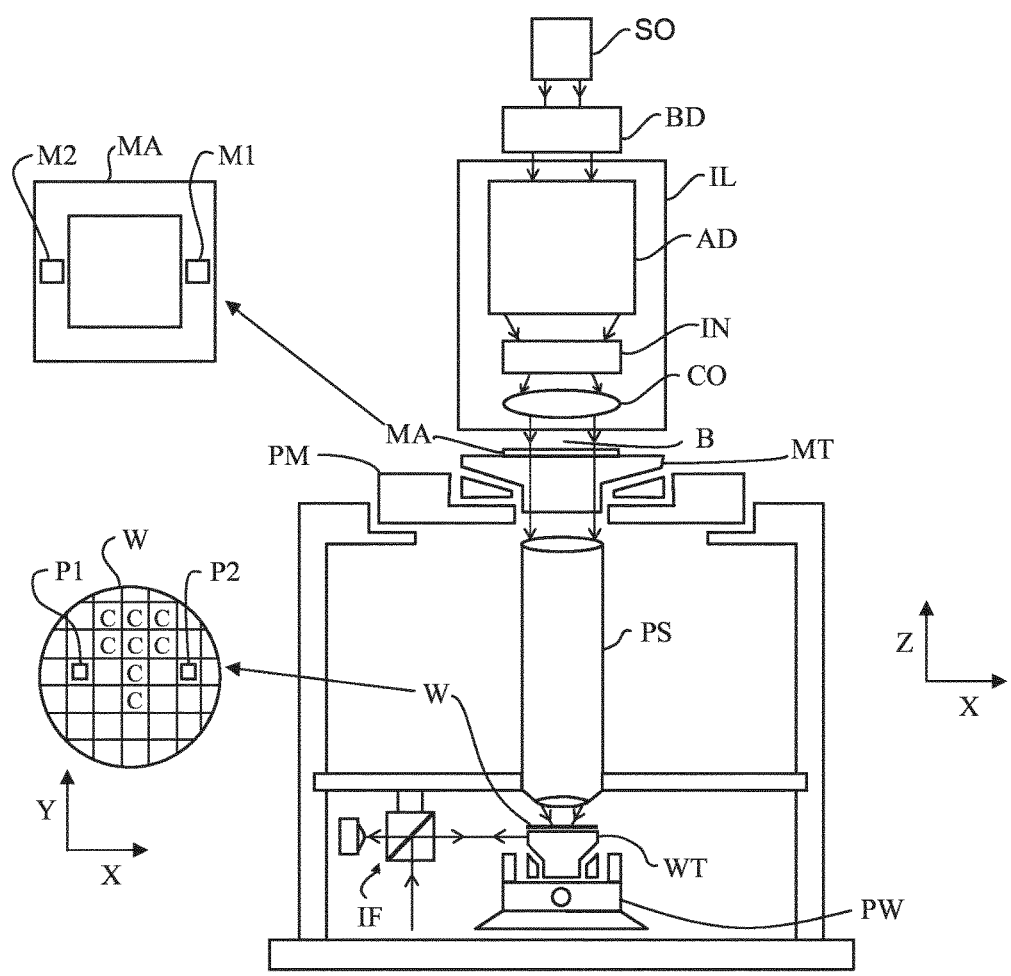
FIG. 1 depicts a lithographic apparatus for using a metrology frame according to an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or to characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus according to one embodiment of the present invention. The apparatus includes an illumination system (illuminator) IL configured to condition a radiation beam B (e.g., UV radiation or any other suitable radiation), a mask support structure (e.g., a mask table) MT constructed to support a patterning device (e.g., a mask) MA and connected to a first positioning device PM configured to accurately position the patterning device in accordance with certain parameters. The apparatus also includes a substrate table (e.g., a wafer table) WT or "substrate support" constructed to hold a substrate (e.g., a resist-coated wafer) W and connected to a second positioning device PW configured to accurately position the substrate in accordance with certain parameters. The apparatus further includes a projection system (e.g., a refractive projection lens system) PS configured to project a pattern imparted to the radiation beam B by patterning device MA onto a target to portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable minor arrays, and programmable LCD panels. Masks are well known in lithography, and include mask types such as binary, alternating phase-shift, and attenuated phase-shift, as well as various hybrid mask types. An example of a programmable minor array employs a matrix arrangement of small minors, each of which can be individually tilted so as to reflect an incoming radiation beam in different directions. The tilted mirrors impart a pattern in a radiation beam which is reflected by the mirror matrix.

The term "projection system" used herein should be broadly interpreted as to encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable minor array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a to radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g., an interferometric device, linear encoder or capacitive sensor), the substrate table WT can be moved accurately, e.g., so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e., a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the mask table MT or "mask support" and the substrate table WT or "substrate support" are scanned synchronously while a pattern imparted to the radiation beam is projected onto a target portion C (i.e., a single dynamic exposure). The velocity and direction of the substrate table WT or "substrate support" relative to the mask table MT or "mask support" may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable minor array of a type as referred to above.

Combinations and/or variations on the above described modes of use or entirely different modes of use may also be employed.

Figure 2:
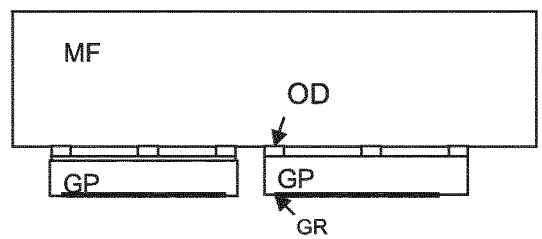
FIG. 2 depicts a metrology frame according to the prior art.

FIG. 2 depicts a metrology frame according to the prior art. The metrology frame MF may be connected to at least a portion of the projection system (PS in FIG. 1) to provide a reference to the projection system. A grid plate GP made of Zerodur™ may be mounted to the metrology frame MF and the grid GR may be used by an encoder provided to the substrate table (WT in FIG. 1) to measure the position of the substrate table with respect to the projection system. Alternatively, the 'gridplate' may be mounted to the substrate table WT (in FIG. 1) and the encoder may be mounted to the metrology frame to measure the position of the substrate table with respect to the metrology frame. The metrology frame MF and the grid-plate GP may be mounted to each other having dynamics in a similar frequency range. An important disturbance force for the metrology frame MF may be flow induced vibrations, which may lead to vibration problems in both the metrology frame MF, and due to a resonating mount in vibration problems in the grid plate GP. The grid plate GP may also suffer from vibrations caused by turbulence caused by the moving substrate table. A damper, for example oil damper OD may be used for damping vibrations in the resonating mount between the metrology frame MF and the grid plates GP.

Figure 3:
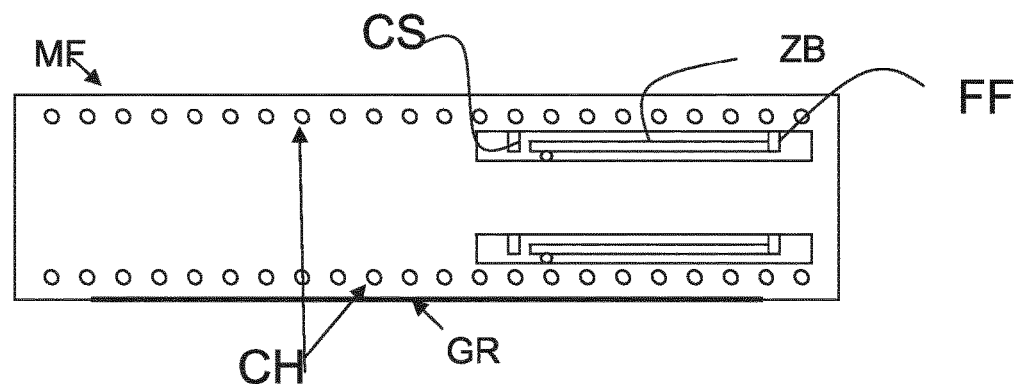
FIG. 3 depicts a metrology frame according to an embodiment.

FIG. 3 depicts a metrology frame according to an embodiment of the present invention. The present invention integrates the functionality of the metrology frame MF and the grid plate GP into 1 structure. The grid GR is written onto the metrology frame MF. The grid may be protected with a protective layer on top. The metrology frame MF may be made from Aluminium or SiSiC. SiSiC may have better stiffness-properties (i.e., dynamical performance) and a 10 times lower CTE (coefficient of thermal expansion). The metrology frame MF may be provided with channels CH for providing a temperature control medium to the metrology frame MF. The channels may be provided near the surface of the metrology frame so as to circumvent a heat load to reach the center of the metrology frame MF. The temperature control medium may be water or may be a 2 phase cooling medium, for example CO2 as explained in more detail with reference to U.S. provisional application No. 61/477,496, titled "A Two-Phase Cooling System For Cooling A Part Of A Lithographic Apparatus and Cooling Method", filed Apr. 20, 2011, U.S. provisional application No. 61/587,344, Titled "A Cooling System For Cooling A Part Of A Lithographic Apparatus and A Cooling Method", filed Apr. 17, 2012, and US patent application publication 20120267550, titled "Thermal Conditioning System For Thermal Conditioning A Part Of A Lithographic Apparatus And A Thermal Conditioning Method", which are incorporated by reference herein in their entireties. Usage of CO2 solves the current flow induced vibration problem of the metrology frame MF because there is less current flow of fluids through the channels. The heat transfer efficiency of CO2 is much higher compared to cooling water with a realistic current flow. The aluminum metrology frame MF may have a low thermal sensitivity while it has both a significant thermal mass and more over a very high conduction to the channels, due to the large cooling-area and the significant cooling with the high convection mass. The aluminum metrology frame MF may have a relatively high coefficient of thermal expansion and the frame may expand relatively much assuming a certain temperature rise. This may be solved by preventing temperature rises, for example by using the very high heat-transfer coefficient of CO2 resulting in low milli-Kelvin rises. Further it may be solved or compensated for by measuring the deformation with a deformation measurement system. The deformation may be measured by having a deformation measurement system comprising a bar ZB, for example made of Zerodur™ provided to the metrology frame. The bar ZB may be fixed at one point FF to the rest of the metrology frame MF and at the other side may be moveable with respect to the rest of the metrology frame. With a sensor, for example a capacitive sensor CS the relative movement between the Zerodur™ end point and the metrology frame MF may be measured. For this purpose the capacitive sensor may comprise a first electrode provided to a first portion of the metrology frame and a second electrode to a second portion of the metrology frame e.g., the bar ZB and the capacitive sensor may determine a displacement between the electrodes to measure the deformation of the metrology frame. The measured deformation may be used to adjust the metrology system so as to compensate for the deformation of the metrology frame. Two deformation measurement systems in first direction are depicted but more may be used to measure the deformation in multiple directions. For example the deformation may be measured in a second direction perpendicular to the first direction so as to also compensate deformations in the second direction.

Figure 4:
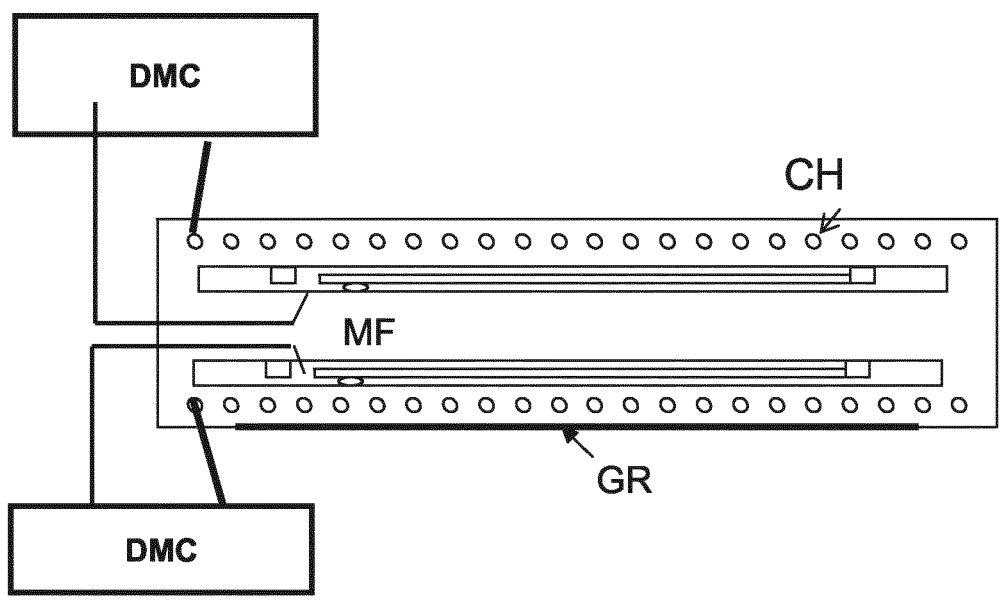
FIG. 4 depicts a metrology frame according to a further embodiment.

FIG. 4 depicts a metrology frame according to a further embodiment. Again, the deformation is measured similar as in FIG. 3 with a deformation measurement system. The measurement result may be forwarded to a deformation controller DMC operable connected to the deformation measurement system. As a function of the measured deformation a pressure control system constructed and programmed to adjust a pressure of a two phase medium in a group of channels may adjust a temperature of the group of channels by adjusting the pressure. Because of the very high heat-transfer coefficient of a two phase medium we may control very small temperature rises and therefore deformations. Note that the impact of a local heat loads may be very well counteracted by the CO2. Because the effect of a more local heat load results in a locally higher flux the heat-transfer coefficient of the 2-phase cooling medium increases, counteracting the impact of hot-spots. The metrology frame may be provided with multiple groups of channels with their individual deformation controllers DMC, temperature controls systems and deformation measurement systems to control the temperature in each group individually to control deformation of the metrology frame in multiple degrees of freedom. The channels may be grouped together in channel groups and each group may be provided with its own temperature control system connected with its own deformation controller DMC. For example, in the metrology frame of FIG. 4 the deformation controller DMC in the top portion of the metrology frame MF may be used to control the channel group CH in the top portion of the metrology frame to minimize deformation.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the present invention in the context of optical lithography, it will be appreciated that the present invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the present invention have been described above, it will be appreciated that the present invention may be practiced otherwise than as described. For example, the present invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the present invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A lithographic apparatus comprising:
   a substrate table configured to hold a substrate;
   a projection system configured to image a pattern onto the substrate; and
   a metrology system, configured to measure a position of the substrate table with respect to the projection system, comprising:
   a metrology frame coupled to the projection system;
   a deformation measurement system, configured to measure a deformation of the metrology frame, comprising:
   a first measurement system configured to measure the deformation of the metrology frame along a first direction, and
   a second measurement system configured to measure the deformation of the metrology frame along a second direction that is different from the first direction,
   wherein each of the first and second measurement systems comprises a deformation measurement bar having first and second ends, the first end being fixed with respect to the metrology frame and the second end being moveable with respect to the metrology frame:
   a control system configured to control a temperature of the metrology frame based on the measured deformation of the metrology frame; and
   an encoder, coupled to the substrate table and facing a surface of the metrology frame, configured to measure the position of the substrate table relative to the metrology frame.

2. The lithographic apparatus of claim 1, further comprising an adjustment system configured to adjust the metrology system to compensate for the deformation of the metrology frame.

3. The lithographic apparatus of claim 1, wherein:
   the metrology system further comprises a channel, in an interior of the metrology frame, configured to flow a fluid through the metrology frame; and
   the control system is further configured to control a pressure of the fluid based on the measured deformation of the metrology frame for controlling a heat transfer between the metrology frame and the fluid in the channel.

4. The lithographic apparatus of claim 3, wherein the fluid comprises water or a two phase cooling medium.

5. The lithographic apparatus of claim 1, further comprising a grid positioned on the surface of the metrology frame, wherein the encoder is configured to measure the position of the substrate table relative to the grid.

6. The lithographic apparatus of claim 5, wherein the grid comprises a grating on the surface.

7. The lithographic apparatus of claim 5, wherein the metrology system further comprises a layer configured to protect a top surface of the grid.

8. The lithographic apparatus of claim 1, wherein:
   each of the first and second measurement systems comprises:
   a first electrode having the first and second ends, the first end being fixed with respect to a first portion of the metrology frame and the second end being moveable with respect to the metrology frame, and
   a second electrode coupled to a second portion of the metrology frame; and
   each of the first and second measurement systems is configured to determine a displacement between the first and second electrodes to measure the deformation of the metrology frame.

9. A metrology system configured to measure a position of a moveable object with respect to a reference object, the metrology system comprising:

a metrology frame coupled to the reference object;
a deformation measurement system, configured to measure a deformation of the metrology frame, comprising:
   a first measurement system configured to measure the deformation of the metrology frame along a first direction, and
   a second measurement system configured to measure the deformation of the metrology frame along a second direction that is different from the first direction,
   wherein each of the first and second measurement systems comprises a bar having first and second ends, the first end being fixed with respect to the metrology frame and the second end being moveable with respect to the metrology frame;
a control system configured to control a temperature of the metrology frame based on the measured deformation of the metrology frame; and
an encoder, coupled to the moveable object, configured to measure the position of the moveable object relative to the metrology frame.

10. The metrology system of claim 9, further comprising a grid positioned on a surface of the metrology frame,
   wherein the encoder is configured to measure the position of the moveable object relative to the grid.

11. The metrology system of claim 10, further comprising a layer configured to protect a top surface of the grid.

12. The metrology system of claim 9, further comprising a channel configured to circulate a fluid through the metrology frame; and
   wherein the control system is further configured to adjust a pressure of the fluid based on the measured deformation of the metrology frame.

13. The metrology system of claim 12, wherein the fluid comprises water or a two phase cooling medium.

14. The metrology system of claim 13, wherein the two phase cooling medium comprises carbon dioxide.

15. The metrology system of claim 9, wherein the second direction is perpendicular to the first direction.

16. The metrology system of claim 9, wherein:
   each of the first and second measurement systems comprises:
      a first electrode having the first and second ends, the first end being fixed with respect to a first portion of the metrology frame and the second end being moveable with respect to the metrology frame, and
      a second electrode coupled to a second portion of the metrology frame; and
   each of the first and second measurement systems is configured to determine a displacement between the first and second electrodes to measure the deformation of the metrology frame.

17. The metrology system of claim 9, wherein:
   the moveable object comprises a substrate table configured to hold a substrate; and
   the reference object comprises a projection system configured to image a pattern onto the substrate.

* * * * *